United States Patent [19]

Nakano

[11] 4,384,347

[45] May 17, 1983

[54] SEMICONDUCTOR MEMORY DEVICE

[75] Inventor: Tomio Nakano, Kawasaki, Japan

[73] Assignee: Fujitsu Limited, Kawasaki, Japan

[21] Appl. No.: 245,728

[22] Filed: Mar. 20, 1981

[30] Foreign Application Priority Data

Mar. 28, 1980 [JP] Japan .................................. 55-39892
Mar. 28, 1980 [JP] Japan .................................. 55-39893

[51] Int. Cl.³ ............................................ G11C 13/00
[52] U.S. Cl. .................................... 365/189; 365/230; 357/23
[58] Field of Search ................... 365/189, 230; 357/23, 357/24

[56] References Cited

U.S. PATENT DOCUMENTS 4,012,757  3/1977  Koo ........................................ 357/24

OTHER PUBLICATIONS

Electronics, "What to Expect Next: A Special Report" by John G. Posa, May 22, 1980, vol. 53, No. 12, pp. 119–122.

Primary Examiner—Terrell W. Fears
Attorney, Agent, or Firm—Staas & Halsey

[57] ABSTRACT

A semiconductor memory device comprising a plurality of memory blocks each including a sense amplifier array and a pair of memory cell groups disposed on both sides of the sense amplifier array, a row decoder for selecting a row line in the plurality of memory blocks, pairs of bus lines, each pair corresponding to one of the sense amplifier arrays and, a column decoder. The column decoder is provided commonly to the plurality of memory blocks and selectively connects a pair of input/output terminals of a sense amplifier of the sense amplifier array in each of the memory blocks to a corresponding one of the pairs of bus lines.

20 Claims, 10 Drawing Figures

SEMICONDUCTOR MEMORY DEVICE

BACKGROUND OF THE INVENTION (1) Field of the Invention

The present invention relates to a semiconductor memory device, and more particularly to a dynamic type semiconductor RAM device having a large memory capacity in which the arrangement of column decoders is improved so that a greater portion of a chip area can be used for forming memory cells.

(2) Description of the Prior Art

Figure 1:
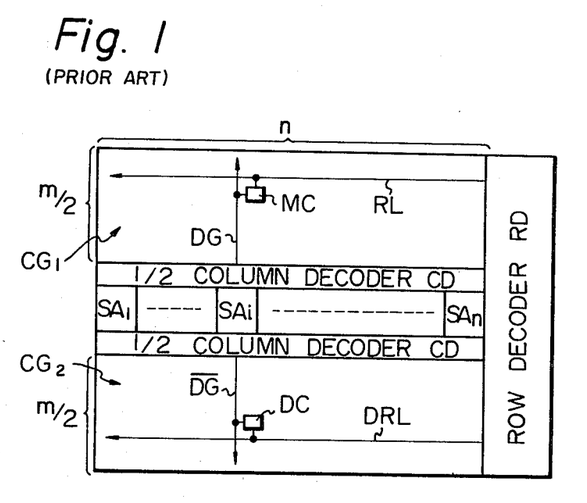
FIG. 1 illustrates an arrangement of circuit components on a semicondutor chip of a conventional dynamic type RAM device.

FIG. 1 illustrates an arrangement of circuit components on a semiconductor chip of a conventional MOS dynamic type RAM device having a small or medium memory capacity, for example 4K bits or 16K bits. In the RAM device of FIG. 1, sense amplifiers $SA_1$ through $SA_n$ are arranged in a line at the center of the semiconductor chip, and a plurality of memory cells MC, each comprising a MOS transistor and a capacitor, are divided into two cell groups, $CG_1$ and $CG_2$ which are arranged on both sides of the sense amplifiers. The RAM device of FIG. 1 has a memory capacity of $n \times m$ bits and each of the cell groups $CG_1$ and $CG_2$ has $n \times m/2$ memory cells. In the area of the cell group $CG_1$, there are arranged $m/2$ row lines or word lines RL which are connected to and selected by row decoders RD and which extend in the transverse direction in FIG. 1, and, n digit lines $\overline{DG}$ each of which is connected to one of a pair of input/output terminals of the sense amplifiers $SA_1$ through $SA_n$ and which extend in the longitudinal direction in FIG. 1. In the area of the cell group $CG_2$, there are also arranged $m/2$ row lines or word lines RL which are connected to and selected by the row decoders RD and which extend in the transverse direction in FIG. 1, and, n digit lines DG each of which is connected to another one of the pair of the input/output terminals of the sense amplifiers $SA_1$ through $SA_n$ and which extend in the longitudinal direction in FIG. 1. At each cross point of one of the row lines RL and one of the digit lines DG or $\overline{DG}$, there is disposed the memory cell MC. In each of the areas of the cell groups $CG_1$ and $CG_2$, a dummy word line DRL is respectively disposed and at each one of the cross points between the dummy word lines DRL and the digit lines DG and $\overline{DG}$, a dummy memory cell (hereinafter referred to as a dummy cell) DC is respectively disposed. In FIG. 1, only one of the memory cells MC and only one of the dummy cells DC are illustrated and illustration of the other memory cells and the dummy cells is omitted. When, for example, a "real" memory cell MC connected to the digit line $\overline{DG}$, which is connected to the sense amplifier $SA_i$, is selected in the first cell group $CG_1$, a dummy cell DC connected to the digit line DG which is connected to the same sense amplifier $SA_i$ is selected in the second cell group $CG_2$. Therefore, FIG. 1 illustrates the memory cell MC and the dummy cell DC which are selected at the same time. Although they are not shown in FIG. 1, a pair of bus lines are disposed on both sides of an array of the sense amplifiers $SA_1$ through $SA_n$ and an output signal from each of the sense amplifiers $SA_1$ through $SA_n$ is derived through the pair of bus lines. The connection between the bus lines and the digit lines DG and $\overline{DG}$, and therefore the selection of one of the sense amplifiers $SA_i$ (i=1, 2, ..., n), is effected by column decoders CD. The column decoders CD are divided into two half groups and disposed on both sides of the sense amplifiers $SA_1$ through $SA_n$, i.e., on the sides of the digit line DG and the digit line $\overline{DG}$, in order to keep a symmetry in the electrical characteristics of the sense amplifier circuits.

Figure 2:
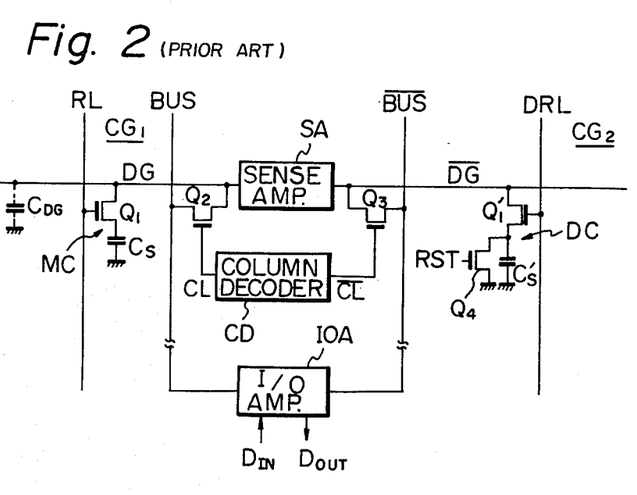
FIG. 2 illustrates a circuit of a main part of the RAM device of FIG. 1.

FIG. 2 illustrates a detailed circuit of a part of the memory device of FIG. 1. As illustrated in FIG. 2, the memory cell MC comprises an MOS transistor $Q_1$, which is turned on when the word line RL is selected and the potential of the word line RL is high, and a capacitor $C_S$ connected between the source electrode of the MOS transistor $Q_1$ and the ground. The dummy cell DC comprises: a MOS transistor $Q_1'$ which is turned on when the dummy word line DRL is selected and the potential of the dummy word line DRL is high; a capacitor $C_S'$ which is connected between the source electrode of the MOS transistor $Q_1'$ and the ground and whose capacitance is approximately equal to half of that of the capacitor $C_S$ of the memory cell MC; and an MOS transistor $Q_4$ which is turned on by a reset signal RST and which discharges the electric charge of the capacitor $C_S'$ before the read-out of information from the memory cell MC is effected.

The read-out of information from the memory cell MC is started, as is well known, from precharging the digit lines DG and $\overline{DG}$. Then, one of the word lines RL and one of the dummy word lines DRL are selected by the row decoder RD; and the transistor $Q_1$ of the memory cell MC connected to the selected word line RL and the transistor $Q_1'$ of the dummy cell DC connected to the selected dummy word line DRL are both turned on; so that the capacitors $C_S$ and $C_S'$, of the selected memory cell MC and dummy cell DC are connected to the digit lines DG and $\overline{DG}$, respectively. Since the capacitor $C_S'$ of the dummy cell DC is previously discharged by the transistor $Q_4$, the potential of the digit line $\overline{DG}$ slightly falls after the above-mentioned connection is effected. On the other hand, the potential of the digit line DG falls greatly when the capacitor $C_S$ of the real cell MC is not charged i.e., when the information "0" is written into the real cell MC, because the capacitance of the capacitor $C_S$ is larger than that of the capacitor $C_S'$. When the capacitor $C_S$ is charged, i.e., when the information "1" is written into the real cell MC, the potential of the digit line DG does not change, because the potential of the precharged digit line DG is equal to that of the capacitor $C_S$. The sense amplifier SA detects and amplifies the potential difference between the digit lines DG and $\overline{DG}$, and the output from the sense amplifier SA appears on the same digit lines DG and $\overline{DG}$ so that the potential difference between the digit lines DG and $\overline{DG}$ is increased. Then transistors $Q_2$ and $Q_3$ are both turned on by the column decoder CD and the digit lines DG and $\overline{DG}$ are respectively connected to the bus lines BUS and $\overline{BUS}$; so that the potentials of the bus lines BUS and $\overline{BUS}$ are equal to those of the digit lines DG and $\overline{DG}$, respectively. An input/output amplifier IOA amplifies the potentials of the bus lines BUS and $\overline{BUS}$ and generates a read-out signal $D_{OUT}$ from the memory cell MC.

The write-in of information to the selected memory cell MC is effected by applying a write-in signal $D_{IN}$ to the input/output amplifier IOA. According to the high or low level of the write-in signal $D_{IN}$, the potentials of the bus lines BUS and $\overline{BUS}$ become, for example, high and low or low and high, respectively, and the potentials of the digit lines DG and $\overline{DG}$ follow the potentials of the bus lines BUS and $\overline{BUS}$ when the transistors $Q_2$ and Q₃ are turned on. Then the transistor Q₁ of the selected memory cell MC is turned on by the high level signal applied to the word line RL; and the capacitor $C_S$ of the selected memory cell MC is charged, i.e., the write-in of information is effected.

Figure 3:
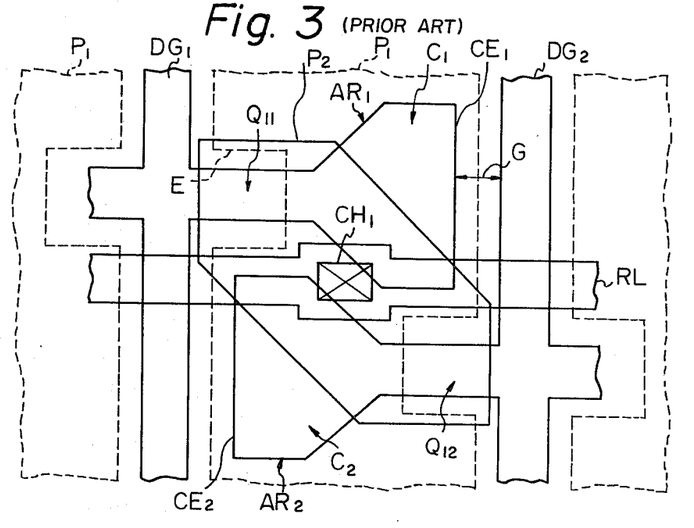
FIG. 3 illustrates a structure of a part of the RAM device of FIG. 1.

FIG. 3 illustrates an example of a structure of the above-mentioned dynamic-type semiconductor RAM device having the memory cells each of which comprises a transistor and a capacitor. The dynamic-type RAM device of FIG. 3 has what is called a two polysilicone layer structure which uses a first polycrystalline silicon (hereinafter referred to as polysilicone) layer $P_1$ and a second polysilicone layer $P_2$. The device of FIG. 3 has a three layer structure and comprises: the polysilicone layer $P_1$ formed on a silicone semiconductor substrate (not shown in the drawing) with a gate oxide layer or a field oxide layer formed therebetween; the polysilicone layer $P_2$ formed on the polysilicone layer $P_1$ with an insulation layer formed therebetween and formed on the silicone semiconductor substrate with a gate oxide layer formed therebetween; and row lines RL as a third layer formed on the polysilicone layer $P_2$ with an insulation layer formed therebetween. The third layer, i.e., the row lines RL each of which is connected to the second layer $P_2$ at a contact hole $CH_1$, is made of aluminum. In FIG. 3, a plan view of two bit memory cells is shown, and each one of the memory cells comprises a MOS transistor $Q_{11}$ or $Q_{12}$ and an MOS capacitor $C_1$ or $C_2$. On fishtail shaped areas $AR_1$ and $AR_2$, which constitute parts of the transistors $Q_{11}$ and $Q_{12}$, respectively, and the capacitors $C_1$ and $C_2$, respectively, a thin gate oxide layer is formed; and these areas $AR_1$ and $AR_2$ are separated by a thick field oxide layer. Therefore, the first layer $P_1$ forms a common capacitor electrode for the capacitors $C_1$, $C_2$ and so on for the memory cells disposed in the same column. The second layer $P_2$ having an elongated hexagon shape forms the common gate electrodes of the transistors $Q_{11}$ and $Q_{12}$. As illustrated by a dotted line, each of the first layers $P_1$ is formed separately for every column and has square shaped cut off portions E. In the conventional semiconductor device of FIG. 3, the digit lines $DG_1$ and $DG_2$, which are connected to the drain or source electrode of the transistors $Q_{11}$ and $Q_{12}$, comprise a diffusion layer formed in the semiconductor substrate. Therefore, each of the first layers $P_1$ must be separated from each other in every column, in order to form the above-mentioned diffusion layers, i.e., the digit lines.

In the above-mentioned structure, the bias potential is always applied to the first layer $P_1$ in order to constitute the capacitors $C_1$ and $C_2$, i.e., in order to form an inversion layer on the surface of the semiconductor substrate, and electric charges are injected into the inversion layer according to the potential level of the input signal when the write-in of information is effected. When the read-out of information is effected, the transistors $Q_{11}$ and $Q_{12}$ are turned on by applying, for example, a high level voltage to the row line RL, so that the capacitors $C_1$ and $C_2$ ae connected to the digit lines $DG_1$ and $DG_2$, respectively. Although they are not shown in the drawing, a large number of memory cells, therefore, a large number of transistors each corresponding to the transistor $Q_{11}$ or $Q_{12}$, are connected to the row line RL. Therefore, when the above-mentioned high level voltage is applied to the row line RL, all the transistors connected to the row line RL are turned on and all the capacitors of the memory cells are connected to the corresponding digit lines. However, only one digit line is connected to the bus line by the column decoder so that only one of the memory cells is selected. For example, when the memory cell comprising the capacitor $C_1$ is selected, the digit line $DG_1$ is connected to the bus line.

In the aforementioned RAM device, each of the column decoders CD of FIG. 2 corresponds to one of the sense amplifiers SA. When the RAM device comprises n sense amplifiers $SA_1$ through $SA_n$, as illustrated in FIG. 1, the same number of column decoders, i.e., n column decoders CD are disposed along the array of the sense amplifiers. For example, in a 16K bit RAM device, if m=n=128, the number of the sense amplifiers SA and thus the number of the column decoders CD are both equal to 128. In the aforementioned conventional RAM device, the m×n bit memory cells are divided into two cell groups $CG_1$ and $CG_2$, as illustrated in FIG. 1, so that m/2 memory cells are connected to each one of the digit lines which are connected to the sense amplifiers SA. Therefore, according to the increase of m, the length of each of the digit lines DG and $\overline{DG}$ increases, so that the stray capacitance $C_{DG}$ between each of the digit lines and the ground increases. As is apparent from the aforementioned read out operation of the dynamic type RAM device, if the stray capacitance $C_{DG}$ is too large, the potential difference between the digit lines DG and $\overline{DG}$ in the read out status becomes small, so that the read out of information becomes very difficult. Assume that the precharge potential of the digit line DG is equal to $V_d$ and that the capacitor $C_S$ of the selected memory cell MC is not charged. In this condition, the potential change $\Delta V_{SIG}$ of the digit line DG after the turn-on of the transistor $Q_1$ of the selected memory cell MC is as follows.

$$\Delta V_{SIG} = \frac{C_S}{C_S + C_{DG}} \cdot V_d \qquad (1)$$

The ratio of $C_{DG}$ to $C_S$, i.e., $C_{DG}/C_S$, is generally called a capacitance ratio $\gamma$. The formula (1) is expressed by using $\gamma$ as follows.

$$\Delta V_{SIG} = \frac{1}{1+\gamma} \cdot V_d \qquad (2)$$

The input voltages of the sense amplifier SA are the potential change $\Delta V_{SIG}$ of the digit line DG and the potential change $\Delta \overline{V}_{SIG}$ of the digit line $\overline{DG}$. If the capacitance of the capacitor $C_S'$ of the dummy cell DC is equal to a half of that of the capacitor $C_S$ of the real cell MC, the potential change $\Delta \overline{V}_{SIG}$ of the digit line $\overline{DG}$ is approximately equal to a half of the potential change $\Delta V_{SIG}$ of the digit line DG, because the capacitance ratio $\gamma$ is amply larger than 1. Therefore, the differential input voltage of the sense amplifier SA is as follows.

$$\Delta V_{SIG} - \Delta \overline{V}_{SIG} = \frac{1}{2} \cdot \frac{1}{1+\gamma} \cdot V_d \qquad (3)$$

In general, $V_d$ is approximately equal to 3 V and $\gamma$ is approximately in the range between 10 through 15. Therefore, if $\gamma+1=10$, the differential input voltage of the sense amplifier SA is equal to 150 mV from the formula (3). Since the lower limit of the differential input voltage of the usual sense amplifier SA is approximately 100 mV, if $\gamma=10\sim15$, the read-out signal from the memory cell MC can easily be detected by the sense amplifier SA. It should be noted that this condition is satisfied only in the range $m \leq 128$, and the 16K RAM device in which $m=n=128$ satisfies this condition. However, when the memory capacity of the RAM device having the arrangement of FIG. 1 increases, for example, to 256K bit, i.e., $m=n=512$ and thus $m/2=256$, the stray capacitance $C_{DG}$ of the digit line DG increases and $\gamma \approx 40 \sim 60$. Therefore, the differential input voltage of the formula (3) becomes tens of mV, so that the sense amplifier cannot detect the differential input voltage.

In order to decrease the length of each of the digit lines DG in the RAM device having a large memory capacity, for example, 256K bit or more, it is possible to increase the number of the memory cells disposed along the row lines RL by increasing the length of the row lines RL and to decrease the number of the memory cells disposed along the digit lines DG. That is, instead of using the square shaped cell matrix, in which $m=n$, the rectangular shaped cell matrix, in which $n>m$, can be used. For example, in the 256K bit RAM device, if $n=1024$, $m=256$ or $n=2048$, $m=128$, the length of each of the digit lines DG can be decreased, so that the above-mentioned problem can be prevented. However, the shape of the semiconductor chip of such a RAM device becomes rectangularly elongated in accordance with the shape of the cell matrix, so that it is difficult to mount the semiconductor chip in a usual IC package which is designed to mount an approximately square shaped semiconductor chip, and the mechanical strength of the semiconductor chip is decreased.

Figure 4:
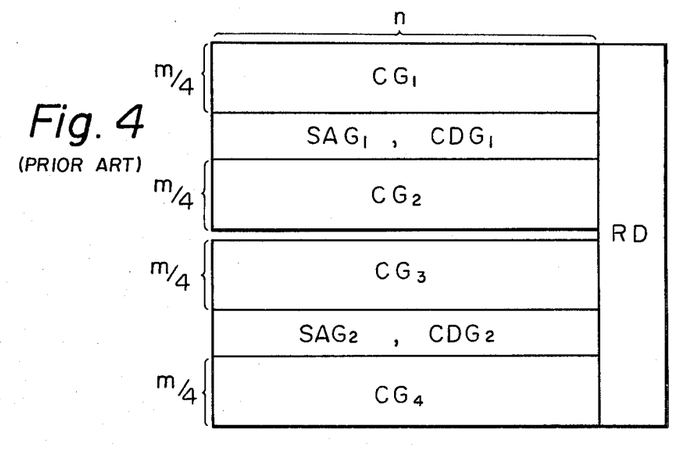
FIG. 4 and FIG. 5 illustrate other examples of arrangements of circuit components on a semiconductor chip of a conventional dynamic type RAM device having a large memory capacity.
Figure 5:
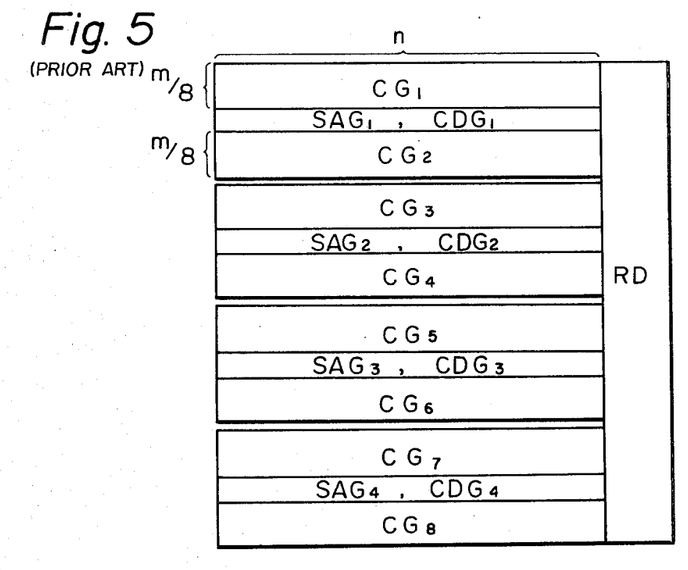

In order to solve the above-mentioned problems, the arrangement in the RAM device illustrated in FIG. 4 or FIG. 5 makes it possible to decrease the number of the memory cells disposed along the digit lines and to make an approximately square shaped memory chip. In FIG. 4, $n \times m$ bits memory cells are divided into four cell groups, $CG_1$ through $CG_4$, each of which contains $n \times m/4$ bit memory cells, and sense amplifier groups $SAG_1$ and $SAG_2$ and column decoder groups $CDG_1$ and $CDG_2$ are disposed between a pair of the cell groups $CG_1$ and $CG_2$ and between another pair of the cell groups $CG_3$ and $CG_4$. In FIG. 5, $n \times m$ bit memory cells are divided into eight cell groups, $CG_1$ through $CG_8$, each of which contains $n \times m/8$ bit memory cells, and the sense amplifier groups $SAG_1$ through $SAG_4$ and the column decoder groups $CDG_1$ through $CDG_4$ are disposed between each pair of the cells groups $CG_1$ and $CG_2$ through $CG_7$ and $CG_8$. In a 256K bit RAM device, the number of the memory cells connected to a digit line is $m/4=128$ in the arrangement of FIG. 4 or $m/8=64$ in the arrangement of FIG. 5, so that the aforementioned capacitance ratio $\gamma$ can be suppressed to under 10 through 15. Therefore, even if the lower limit of the differential input voltage of each of the sense amplifiers in the sense amplifier groups $SAG_1$, $SAG_2$, . . . is approximately 100 mV, the read-out signal from the memory cell can be detected.

Figure 6:
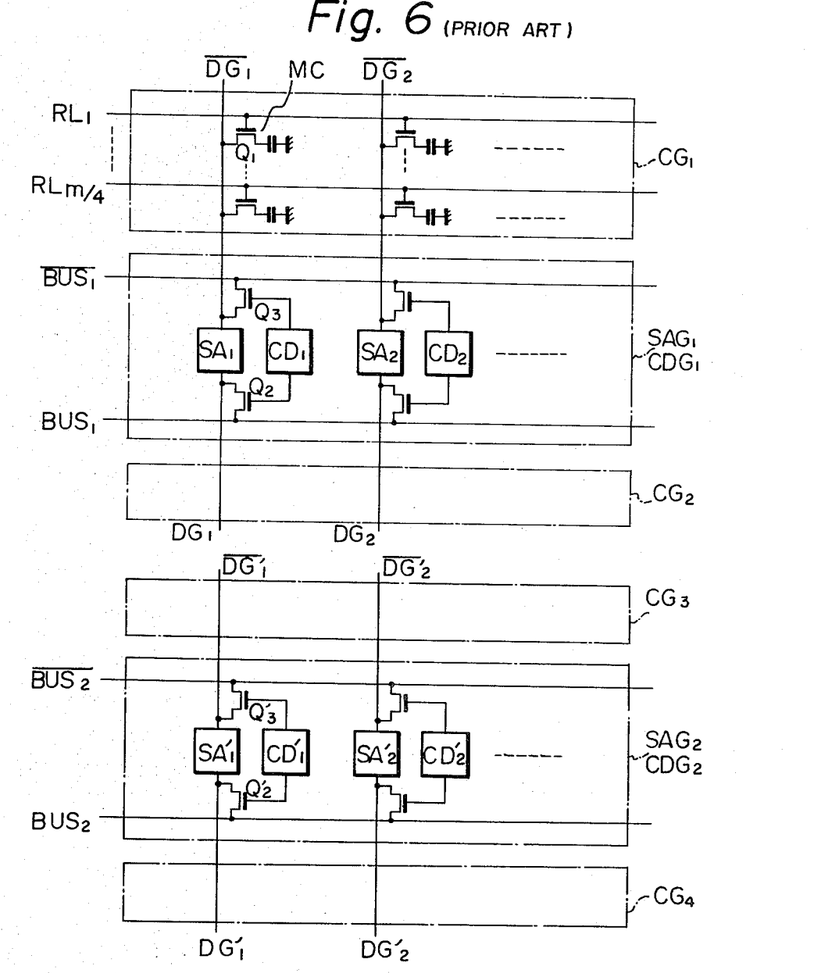
FIG. 6 illustrates a circuit of a main part of the RAM device of FIG. 4.

However, the arrangements of FIG. 4 and FIG. 5, in which each of the column decoder groups $CDG_1$, $CDG_2$, . . . is disposed along both sides of the respective one of the sense amplifier groups $SAG_1$, $SAG_2$, . . . in the same manner to the arrangement of FIG. 1, have several disadvantages which will now be explained with reference to FIG. 6. FIG. 6 illustrates a detailed structure of a part of the RAM device having the arrangement of FIG. 4. In the area of the first cell group $CG_1$, $m/4$ row lines $RL_1$ through $RL_{m/4}$ which contain a dummy row line extend from the row address decoder (not shown in the drawing) in a transversal direction. Digit lines $\overline{DG}_1$, $\overline{DG}_2$, . . . which extend from one side of each of the sense amplifiers $SA_1$, $SA_2$ . . . respectively, of the first sense amplifier group $SAG_1$ intersect with the row lines $RL_1$ through $RL_{m/4}$, and an $n \times m/4$ bit memory cells MC including a dummy cell are disposed at the cross points of these lines. In the area of the second cell group $CG_2$, $m/4$ row lines containing a dummy row line extend from the row address decoder (not shown in the drawing) in a transversal direction. At the cross points of the m/4 row lines and digit lines $DG_1$, $DG_2$, . . . extending from the other side of each of the sense amplifiers $SA_1$, $SA_2$, . . . of the first sense amplifier group $SAG_1$, another $n \times m/4$ 1 bit memory cells including a dummy cell are disposed. A bit of readout information from a memory cell selected from the cell groups $CG_1$ and $CG_2$ is transferred from the sense amplifier to bus lines $BUS_1$ and $\overline{BUS}_1$. The lower half portion of FIG. 6 comprising the third memory cell group $CG_3$, the second sense amplifier group $SAG_2$ and the fourth memory cell group $CG_4$ has the same structure as that of the upper half portion of FIG. 6 described above, and a bit of read-out information from a memory cell selected from the cell groups $CG_3$ and $CG_4$ is transerred to bus lines $BUS_2$ and $\overline{BUS}_2$.

As mentioned above, two column decoder groups $CDG_1$ and $CDG_2$ are used in the RAM device of FIG. 6, that is, the first column decoder group $CDG_1$, comprising the column decoders $CD_1$, $CD_2$, . . . , is used for the first sense amplifier group $SAG_1$, comprising the sense amplifiers $SA_1$, $SA_2$, . . . ; and the second column decoder group $CDG_2$, comprising the column decoders $CD_1'$, $CD_2'$, . . . , is used for the second sense amplifier group $SAG_2$, comprising the sense amplifiers $SA_1'$, $SA_2'$, . . . . It should be noted that, for example, the sense amplifier $SA_1$ is selected by the column decoder $CD_1$ and the sense amplifier $SA_1'$ is selected by the column decoder $CD_1'$, therefore, the digit lines $\overline{DG}_1$ and $DG_1$ and the digit lines $\overline{DG}_1'$ and $DG_1'$, belong to the same column on the $m \times n$ memory matrix. Therefore, the first column decoder group $CDG_1$ and the second column decoder group $CDG_2$ have the same structure and the same decoding function. Consequently, in the RAM device of FIG. 4 or FIG. 5, it is necessary to use a plurality of the column decoder groups having the same structure and the same decoding function, and thus the area occupied by the sense amplifiers and the column decoders on the semiconductor chip becomes large, so that the chip area cannot effectively be used for the memory cells. For example, in the RAM device having the arrangement of FIG. 1, approximately 50% of the chip area can be used for the memory cells, but in the RAM device having the arrangement of FIG. 4 or FIG. 5, only about 40% or 30% of the chip area can be used for the memory cells. Moreover, in the RAM device having the arrangement of FIG. 4 or FIG. 5, since the number of the column decoders which are driven by column address buffers (not shown in the drawings) is large, the load capacitance of each of the column address buffers becomes large, so that the operating speed of the column address buffers is decreased.

SUMMARY OF THE INVENTION

It is, therefore, an object of the present invention to provide a dynamic type semiconductor RAM device which has a large memory capacity and in which the greater portion of the chip area can be used for forming memory cells.

It is another object of the present invention to provide a dynamic type semiconductor RAM device wherein the differential input voltage to each of sense amplifiers does not decrease, even when the memory capacity thereof becomes very large.

It is still another object of the present invention to provide a large capacity dynamic type RAM device having a high operating speed.

It is still another object of the present invention to provide a large capacity dynamic type RAM device wherein the manufacturing process of column lines is simplified.

According to the present invention, there is provided a semiconductor memory device comprising: a plurality of memory blocks each of which includes a sense amplifier array comprising a plurality of sense amplifiers and a pair of memory cell groups each comprising a plurality of dynamic type memory cells which are selectively connected to the sense amplifier array through digit lines; a row decoder for selecting a row line in the plurality of memory blocks; pairs of bus lines, each pair corresponding to one of the sense amplifier array; and a column decoder which is common to said plurality of memory blocks and which selectively connects a pair of input/output terminals of the sense amplifier in each of the memory blocks to a corresponding one of the pairs of bus lines by changing the potential of each of the column lines connected between the column decoder and the plurality of memory blocks.

DESCRIPTION OF THE PREFERRED EMBODIMENT

Figure 7:
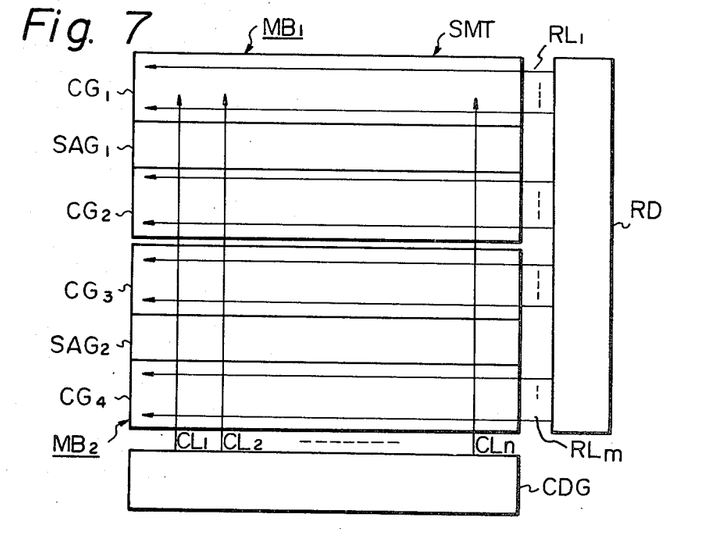
FIG. 7 illustrates an arrangement of circuit components on a semiconductor chip of a large capacity dynamic type RAM device as an embodiment of the present invention.
Figure 8:
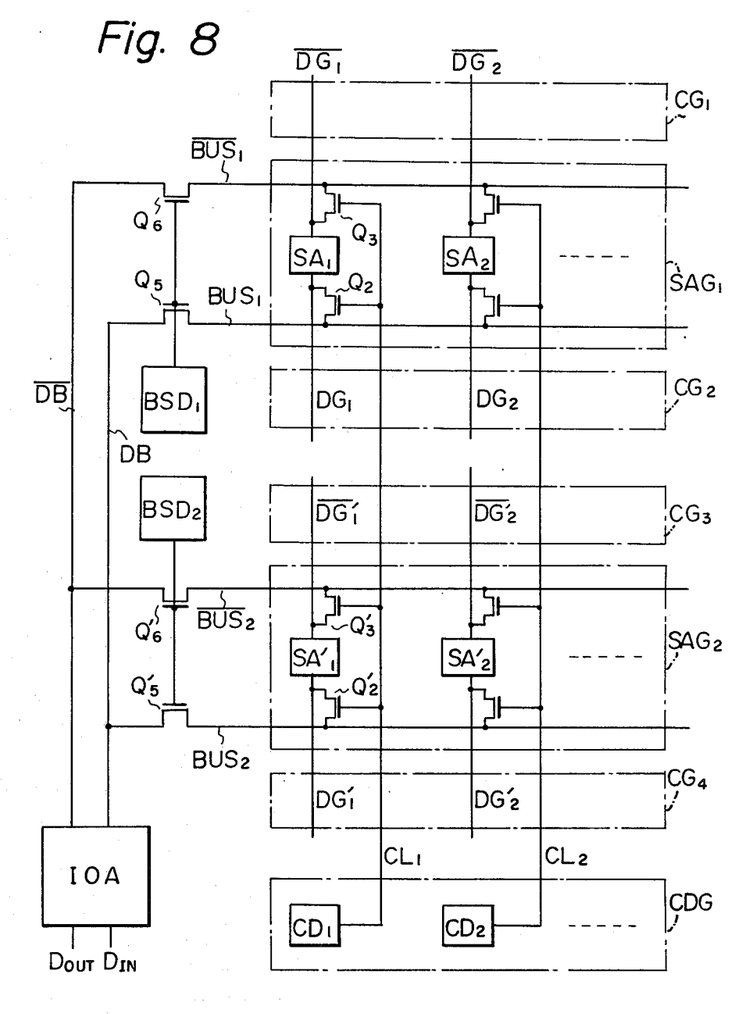
FIG. 8 illustrates a circuit of a main part of the RAM device of FIG. 7.

With reference to FIG. 7 and FIG. 8, an embodiment of the present invention will now be explained. FIG. 7 illustrates a schematic arrangement of circuit components of a dynamic type RAM device as an embodiment of the present invention and FIG. 8 illustrates a detailed circuit of a part of the dynamic type RAM device of FIG. 7. The RAM device of FIG. 7 and FIG. 8 has, as the RAM device of FIG. 4 and FIG. 6, $n \times m$ bit memory cells which are divided into four cell groups $CG_1$ through $CG_4$. In FIG. 7 and FIG. 8, the same parts as appear in FIG. 4 and FIG. 6 are designated by the same reference symbols. The RAM device according to the present invention differs from that of FIG. 4 and FIG. 6 in the following points. The RAM device according to the present invention does not comprise a plurality of column decoder groups disposed along with each of the sense amplifier groups $SAG_1$ and $SAG_2$; but comprises a single common column decoder group CDG disposed parallel to the sense amplifier groups $SAG_1$ and $SAG_2$, for example, outside of the area of the sense amplifier groups $SAG_1$ and $SAG_2$ and the cell groups $CG_1$ through $CG_4$. The sense amplifier group $SAG_1$ and the cell groups $CG_1$ and $CG_2$ disposed on both sides of the sense amplifier group $SAG_1$ constitute a first memory block $MB_1$; and the sense amplifier group $SAG_2$ and the cell groups $CG_3$ and $CG_4$ disposed on both sides of the sense amplifier group $SAG_2$ constitute a second memory group $MB_2$. From each of the column decoders $CD_1$, $CD_2$, . . . in the column decoder group CDG, column select lines, i.e., column lines $CL_1$, $CL_2$, . . . are extended through the memory blocks $MB_1$ and $MB_2$; so that each of the column decoders $CD_1$, $CD_2$, . . . can select a plurality of, i.e., two sense amplifiers of the sense amplifier groups $SAG_1$ and $SAG_2$ belonging to the same column, for example $SA_1$ and $SA_1'$, at the same time. Each of the column lines $CL_1$, $CL_2$, . . . can be formed as a multilayer connecting lead on the area of the memory cells on a semiconductor chip, and each is connected to the gate electrodes of the gate transistors such as $Q_2$, $Q_3$ and $Q_2'$, $Q_3'$ which belong to the same column. In the arrangement of FIG. 7 and FIG. 8, the common column decoder group CDG is disposed at the outside edge of the memory blocks $MB_1$ and $MB_2$. However, it should be noted that the common column decoder group CDG can also be disposed between the memory blocks $MB_1$ and $MB_2$ and parallel to the sense amplifier groups $SAG_1$ and $SAG_2$. When the common column decoder group CDG is disposed at the center of the memory blocks $MB_1$ and $MB_2$, a delay time in transmitting a signal caused by the stray capacitance of column line $CL_1$, $CL_2$ . . . is equal to that of the arrangement of FIG. 7 and FIG. 8. The other portions of the RAM device of FIG. 7 and FIG. 8 are the same as those of the RAM device of FIG. 4 and FIG. 6 and, therefore, the explanation thereof is omitted here.

In the RAM device according to the present invention having the above-mentioned arrangement, the larger part of the chip area can be used for forming the memory cells or the size of the total chip area can be decreased more than in the conventional RAM device of FIG. 4 and FIG. 6. This is because, the RAM device according to the present invention uses only a single column decoder group; so that even if the number of the sense amplifier groups increases and, therefore, even if the number of the cell groups increases according to the increase in the memory capacity of the RAM device, the column decoder group does not occupy a large area on the semiconductor chip. Moreover, in the RAM device according to the present invention, if the chip size is equal to that of the conventional RAM device, the size of each of the memory cells can be larger than that of the conventional RAM device, so that the capacitor $C_S$ in each of the memory cells can be larger and the differential input voltage of each of the sense amplifiers can be larger. Therefore, the design of the sense amplifiers is not difficult, even if the memory capacity of the RAM device is increased. Since the load of column address buffers is only one column address decoder group CDG, the load capacitance of the column address buffers is decreased and the operating speed of the column address buffers can be increased. Moreover, in the RAM device of FIGS. 7 and 8, each of the digit lines does not pass through the column decoders and, therefore, the length of each of the digit lines is decreased, so that the stray capacitance thereof becomes small.

Since, in the above-mentioned arrangement, according to the present invention, two sense amplifiers in the same column, for example $SA_1$ and $SA_1'$ are selected at the same time, output signals from both memory blocks $MB_1$ and $MB_2$, respectively, appear on the bus lines $BUS_1$ and $\overline{BUS}_1$ as well as $BUS_2$ and $\overline{BUS}_2$ at the same time. However, as illustrated in FIG. 8, one of these signals is selected by, for example, gate transistors $Q_5/Q_6$ and $Q_5'/Q_6'$ and bus decoders $BSD_1$ and $BSD_2$ and supplied to an input/output amplifier IOA through data bus lines $\overline{DB}$ and DB, so that the output signal $D_{OUT}$ from one selected memory cell is derived. Each of the bus decoders $BSD_1$ and $BSD_2$ is operated by a part of row address signals and turns on the gate transistors $Q_5$ and $Q_6$ or $Q_5'$ and $Q_6'$ in order to connect the bus lines $\overline{BUS}_1$, $BUS_1$ or $\overline{BUS}_2$ and $BUS_2$ to the data buses $\overline{DB}$, DB. For Example, in the RAM device of FIG. 7 in which n×m bit memory cells are divided into four cell groups $CG_1$ through $CG_4$, the row decoders RD are operated by the N−1 bits of the row address signals and the bus decoder is operated by a remaining one bit of the row address signals, where N is a total bit number of the row address signals or the column address signals, i.e., $2^N = m = n$. In this case, the column decoder group CDG is operated by N bits of the column address signals.

In the above, the RAM device, in which the memory cells are divided into four cell groups $CG_1$ through $CG_4$, is explained. However, it should be noted that the present invention can be adapted to the RAM device in which the memory cells are divided into eight cell groups, as in the RAM device of FIG. 5, or into another number of cell groups.

As is apparent from the above description, in the RAM device according to the present invention, it is necessary for the column lines $CL_1$, $CL_2$, ... to pass through the memory areas, for example, memory blocks $MB_1$ and $MB_2$. However, if the conventional structure of FIG. 3 is used, it is impossible to pass the column lines $CL_1$, $CL_2$, ... through the area of the memory cells in parallel to each of the digit lines $DG_1$, $DG_2$, ...; because, as apparent from FIG. 3, the area between each of the digit lines $DG_1$, $DG_2$, ... is tightly filled with the capacitors and the transistors of each of the memory cells. Moreover, in the conventional structure of FIG. 3, each of the digit lines $DG_1$, $DG_2$, ... is formed by the diffusion layer, so that it is necessary to have a relatively large distance G between an edge $CE_1$ or $CE_2$ of the capacitor $C_1$ or $C_2$ and the digit line $DG_2$ or $DG_1$ corresponding to the other capacitor $C_2$ or $C_1$, respectively, in order to avoid a short circuit therebetween. If the interval between each of the digit lines is decreased in order to increase the packing density of the memory cells, the capacitance of the capacitor $C_1$ or $C_2$ becomes small and the differential input voltage of each of the sense amplifiers becomes small, so that it is difficult to detect information from the memory cell. Since the stray capacitance between each of the digit lines and the ground is relatively large, due to the existence of the junction capacitance between the diffusion layer and the semiconductor substrate having the opposite conductivity to that of the diffusion layer, the number of the memory cells which can be connected to one digit line is decreased. This is because, since the magnitude of the output voltage from the memory cell depends on the capacitance ratio $C_{DG}/C_S$, as mentioned before, the differential input voltage to each of the sense amplifiers is decreased, so that it is necessary to decrease the number of the memory cells connected to one digit line. As a result, the structure of FIG. 3 is not suitable for the RAM device having a large memory capacity according to the present invention.

Figure 9:
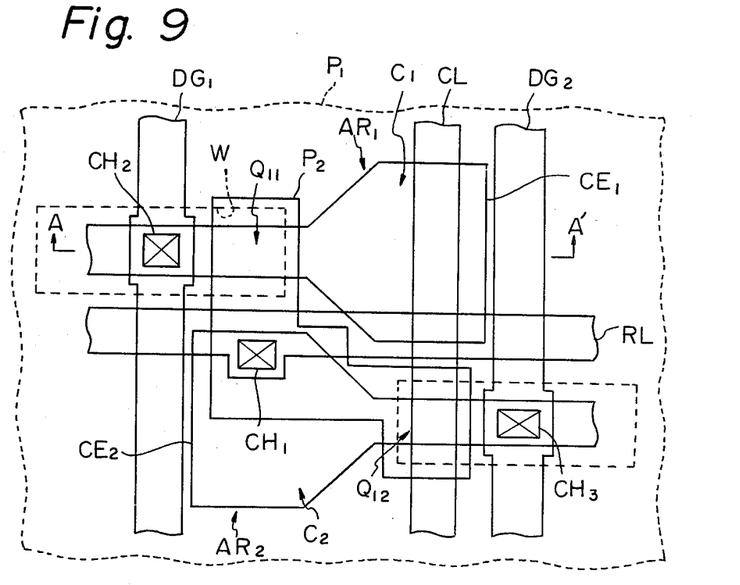
FIG. 9 illustrates a structure of a part of the RAM device of FIG. 7.
Figure 10:
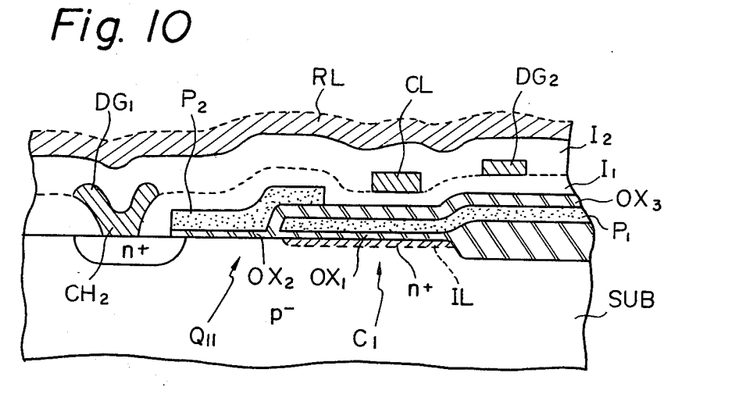
FIG. 10 illustrates a cross section of the RAM device of FIG. 9 taken on line A—A' thereof.

FIG. 9 illustrates a part of a structure of the RAM device which is preferable for the dynamic type RAM device having a large memory capacity according to the present invention, and FIG. 10 is a cross sectional view of the structure of FIG. 9 taken on line A—A'. In FIGS. 9 and 10, the same circuit portions as appear in FIG. 3 are designated by the same reference symbols. In the RAM device of FIG. 9 and FIG. 10, digit lines $DG_1$, $DG_2$, ... are formed, not as a diffusion layer, but as another conducting layer on a semiconductor substrate SUB, and a polysilicon layer $P_1$, i.e., a first conductive layer is formed as a thin film which is not separated by the digit lines $DG_1$, $DG_2$, ... and is common to all columns and which has windows W only in the area illustrated by dotted lines in which memory cell transistors $Q_{11}$, $Q_{12}$, ... are formed. Also in the RAM device of FIGS. 9 and 10, each of the column lines CL is disposed parallel to the digit lines $DG_1$, $DG_2$, ... on the area in which the memory cells are formed. Each of the row lines RL, which are connected to a second conductive layer $P_2$ at a contact hole $CH_1$, is formed as a conductive layer made of a material having a high electrical conductivity such as aluminum, this conductive layer is a fourth layer formed on the digit lines $DG_1$, $DG_2$, ... and each of the column lines CL. Therefore, the RAM device of FIGS. 9 and 10, according to the present invention, has a four layer structure comprising: of the first conductive layer $P_1$ which constitutes a common electrode of the memory capacitors $C_1$, $C_2$, ...; the second conductive layer $P_2$ which is the gate electrode of each of the memory cell transistors $Q_{11}$, $Q_{12}$, ...; the third conductive layer which is the conductive layer having a high electrical conductivity; and the fourth conductive layer which forms the row lines RL. The digit lines $DG_1$, $DG_2$, ... and the column lines $CL_1$, $CL_2$, ... are formed as the third conductive layer having a high electrical conductivity and are disposed in the direction perpendicular to the row lines RL of the fourth conductive layer. The third conductive layer having a high electrical conductivity is made of a metal having a high melting point, such as molybdenum or tungsten or silicate with such metal, or is made of polysilicone or aluminum. The digit lines $DG_1$, $DG_2$, ... of the third conductive layer are formed on a first insulation layer $I_1$ which covers the first conductive layer $P_1$ and the second conductive layer $P_2$ except for the portions of the contact holes $CH_2$, $CH_3$, ... through which the digit lines $DG_1$, $DG_2$, ... of the third conductive layer are respectively connected to $n^+$ layers, i.e., the drain or source electrodes of the transistors $Q_{11}$, $Q_{12}$, .... The digit lines $DG_1$, $DG_2$, ... are covered with a second insulation layer $I_2$ formed thereon and the row lines RL are formed on the second insulation layer $I_2$. Although none of the row lines RL exist on a line A—A' of FIG. 9, FIG. 10 includes an illustration of the row line RL in order to clarify the explanation. The first and second insulating layers $I_1$ and $I_2$ are formed of, for example, a PSG(Phosphosilicate Glass) film, a silicon nitride($Si_3N_4$) film or a silicon oxide($SiO_2$) film made by the CVD(Chemical Vapor deposition) method. In FIG. 10, IL is an inversion layer which forms a capacitor $C_1$ or an impurity layer in which impurities having a reverse conductivity type are doped by the ion implanation technique. $OX_1$ and $OX_2$ are thin layers ($SiO_2$) formed between the substrate SUB and the first conductive layer $P_1$ and between the substrate SUB and the second conductive layer $P_2$. $OX_3$ is an insulating layer ($SiO_2$) formed between the first conductive layer $P_1$ and the second conductive layer $P_2$ and between the first conductive layer $P_1$ and the first insulation layer $I_1$.

In the above-mentioned device structure according to the present invention, none of the digit lines $DG_1$, $DG_2$, . . . is formed as a diffusion layer, so that it is unnecessary to dispose the separation area G of the conventional RAM device of FIG. 3. Therefore, each of the edges $CE_1$, $CE_2$, . . . of the capacitors $C_1$, $C_2$, . . . can be disposed adjacently to the respective one of the digit lines $DG_1$, $DG_2$, . . . . Therefore, the area of each of the capacitors $C_1$, $C_2$, . . . can be larger than that of the conventional RAM device of FIG. 3, if the interval between the digit lines is equal to that of the conventional RAM device of FIG. 3, so that the differential input voltage to each of the sense amplifiers can be increased and design of the sense amplifiers is not difficult, even if the memory capacity is increased. If, in the RAM device according to the present invention, the area of each of the capacitors $C_1$, $C_2$, . . . is equal to that of the conventional RAM device of FIG. 3, it is possible to reduce the interval between the digit lines $DG_1$, $DG_2$, . . . , so that the degree of integration and therefore the memory density of the RAM device can be larger. Since each of the digit lines $DG_1$, $DG_2$, . . . is not a diffusion layer and there exists the first conductive layer $P_1$ and the first insulation layer $I_1$ between the digit lines $DG_1$, $DG_2$, . . . and the semiconductor substrate SUB, the stray capacitance of each of the digit lines can be small. Therefore, it is possible to increase the differential input voltage of each of the sense amplifiers when the number of the memory cells connected to one digit line is the same as that of the conventional RAM device of FIG. 3. As mentioned above, the column lines CL are formed as a third conductive layer, which includes the digit lines $DG_1$, $DG_2$, . . . . Therefore, it is possible to form the column lines CL, which extend from the common column decoder group CDG disposed, for example, at the outer edge of the memory block $MB_2$ as shown in FIG. 7, at the same time as the digit lines $DG_1$, $DG_2$, . . . in the manufacturing process of the RAM device, so that the manufacturing process of the column lines can be simplified.

As is apparent from the above explanation, since the MOS dynamic type RAM device according to the present invention uses a single column decoder group, even when the memory cells are divided into four or more cell groups, and since the RAM device according to the present invention has a four layer structure, the greater portion of the chip area can be used for forming the memory cells and the differential input voltage of each of the sense amplifiers does not decrease, even when the memory capacity is very large.

I claim:

1. A semiconductor memory device comprising: a plurality of memory blocks each including:
a row line; and
a sense amplifier array comprising digit lines, and a plurality of sense amplifiers, operatively connected to said digit lines, each having a pair of input/output terminals; and
a pair of memory cell groups each comprising a plurality of dynamic type memory cells which are selectively connected to said sense amplifier array through said digit lines;
a row decoder, operativelyy connected to each row line of said plurality of memory blocks, for selecting one of the row lines in said plurality of memory blocks;
pairs of bus lines, each pair corresponding to one of said sense amplifier arrays and each pair operatively connectable to corresponding pairs of said input/output terminals;
column lines operatively connected to said pairs of bus lines; and
a column decoder, operatively connected to said column lines, which is common to said plurality of memory blocks and which selectively connects one pair of input/output terminals of said sense amplifiers in each of said memory blocks to a corresponding one of said pairs of bus lines by changing the potential of one of said column lines connected between said column decoder and said plurality of memory blocks.

2. A semiconductor memory device as set forth in claim 1, wherein said column decoder is disposed along an outside edge of the area of said memory blocks.

3. A semiconductor memory device as set forth in claim 1, wherein said column decoder is disposed between said memory blocks.

4. A semiconductor memory device as set forth in claim 3, wherein said column decoder is disposed at the center of said memory blocks.

5. A semiconductor memory device as set forth in claim 1, wherein said column lines from said column decoder pass through the area of said memory blocks.

6. A semiconductor memory device as set forth in claim 5, further comprising gate transistors operatively connected between said pair of input/output terminals and a corresponding one of said pairs of bus lines, wherein said column lines are operatively connected to said gate transistors which selectively connect said pair of input/output terminals of the sense amplifier in each of said memory blocks to a corresponding one of said pairs of bus lines.

7. A semiconductor memory device as set forth in claim 1, wherein each of said pairs of bus lines is disposed parallel to said sense amplifier array of a corresponding one of said memory blocks.

8. A semiconductor memory device as set forth in claim 1, 2, 3, 4, 5, 6 or 7, wherein each of said dynamic type memory cells comprises a capacitor and an MOS transistor.

9. A semiconductor memory device comprising: a plurality of memory blocks each including:
a row line;
a sense amplifier array comprising a plurality of sense amplifiers and digit lines operatively connected to said sense amplifiers; and
a pair of memory cell groups each comprising a plurality of dynamic type memory cells which are operatively connected to said sense amplifier aray through said digit lines and each of said memory cells comprising a capacitor operatively connected to ground and a MOS transistor operatively connected to said capacitor, one of said digit lines and one of said row lines, one of the electrodes of said capacitor being formed as a first conductive layer, and the gate electrode of said MOS transistor being formed as a second conductive layer;

a row decoder, operatively connected to each row line of said plurality of memory blocks, for selecting one of said row lines in said plurality of memory blocks;

pairs of bus lines, each pair corresponding to one of said sense amplifier arrays and each pair operatively connectable to a corresponding one of said sense amplifiers arrays;

column lines operatively connected to said plurality of memory blocks and said pairs of bus lines;

a column decoder, operatively connected to said column lines, which is common to said plurality of memory blocks and which selectively connects one pair of input/output terminals of said sense amplifiers in each of said memory blocks to a corresponding one of said pairs of bus lines by changing the potential of one of said column lines connected between said column decoder and said plurality of memory blocks, said digit lines being formed as a third conductive layer having a first electrical conductivity disposed on said first conductive layer and an insulation layer formed therebetween, said column lines also being formed as said third conductive layer having a first electrical conductivity, and said row lines being formed as a fourth layer having a second electrical conductivity disposed on said third conductive layer and having another insulation layer formed therebetween.

10. A semiconductor memory device as set forth in claim 9, wherein said column decoder is disposed along an outside edge of the area of said memory blocks.

11. A semiconductor memory device as set forth in claim 9, wherein said column decoder is disposed between said memory blocks.

12. A semiconductor memory device as set forth in claim 11, wherein said column decoder is disposed at the center of said memory blocks.

13. A semiconductor memory device as set forth in claim 9, wherein said column lines from said column decoder pass through the area of said memory blocks.

14. A semiconductor memory device as set forth in claim 9, wherein said first conductive layer is formed continuously on a semiconductor substrate and comprises a common electrode of said capacitors of all memory cells of said plurality of memory blocks.

15. A semiconductor memory device as set forth in claim 9, 10, 11, 12, 13 or 14, wherein each first conductive layer is made of polycrystalline silicone.

16. A semiconductor memory device as set forth in claim 9, 10, 11, 12, 13, or 14 wherein said second conductive layer is made of polycrystalline silicone.

17. A semiconductor memory device as set forth in claim 9, 10, 11, 12, 13 or 14, wherein said third conductive layer comprises metal having a high melting point.

18. A semiconductor memory device as set forth in claim 9, 10, 11, 12, 13 or 14, wherein said third conductive layer comprises a silicate with metal having a high melting point.

19. A semiconductor memory device as set forth in claim 9, 10, 11, 12, 13 or 14, wherein said third conductive layer comprises polycrystalline silicone.

20. A semiconductor memory device as set forth in claim 9, 10, 11, 12, 13 or 14, wherein said third conductive layer comprises aluminum.

* * * * *

UNITED STATES PATENT AND TRADEMARK OFFICE
CERTIFICATE OF CORRECTION

PATENT NO. : 4,384,347  
DATED : May 17, 1983  
INVENTOR(S) : Tomio Nakano

Page 1 of 2

It is certified that error appears in the above-identified patent and that said Letters Patent is hereby corrected as shown below:

Front page, [57] ABSTRACT, line 7, after "arrays", insert --,--; delete "," after "and".

Column 1, line 29, "$\overline{DG}$" should be --$\underline{DG}$--;
line 36, "DG" should be --$\overline{DG}$--;
line 52, "$\overline{DG}$" should be --$\underline{DG}$--;
line 55, "DG" should be --$\overline{DG}$--.

Column 2, line 42, "$C_s$is" should be --$C_s$ is--.

Column 3, line 11, "cone" should be --con--;
line 13, "polysilicone" should be --polysilicon--;
line 15, "cone" should be --con--;
"silicone" should be --silicon--;
line 18, "polysilicone" should be --polysilicon--, both occurrences;
line 20, "silicone" should be --silicon--;
line 22, "polysilicone" should be --polysilicon--;
line 60, "ae" should be --are--.

Column 4, line 25, "dynamic type" should be --dynamic-type--;
line 27, "read out" should be --read-out--;
line 28, "read out" should be --read-out--.

Column 5, line 9, "$\approx$" should be --$\div$--.

UNITED STATES PATENT AND TRADEMARK OFFICE
CERTIFICATE OF CORRECTION

PATENT NO. : 4,384,347  
DATED : May 17, 1983  
INVENTOR(S) : Tomio Nakano

Page 2 of 2

It is certified that error appears in the above-identified patent and that said Letters Patent is hereby corrected as shown below:

Column 6, line 16, delete "1";
line 18, "readout" should be --read-out--;
line 20, "$BUS_1$", second occurrence, should be --$\overline{BUS}_1$--;
line 27, "$BUS_2$", second occurrence, should be --$\overline{BUS}_2$--.

Column 7, line 24, "array" should be --arrays--.

Column 9, line 25, "," should be --and--;
line 26, ",", second occurrence, should be --and--;
"Example" should be --example--.

Column 10, line 56, "polysilicone" should be --polysilicon--.

Column 12, line 10, "operativelyy" should be --operatively--.

Signed and Sealed this

Twentieth Day of December 1983

[SEAL]

Attest:

GERALD J. MOSSINGHOFF

Attesting Officer  Commissioner of Patents and Trademarks